United States Patent
Mishima et al.

(10) Patent No.: US 6,677,222 B1
(45) Date of Patent: Jan. 13, 2004

(54) METHOD OF MANUFACTURING SEMICONDUCTOR DEVICE WITH POLYSILICON FILM

(75) Inventors: Yasuyoshi Mishima, Kawasaki (JP); Katsuyuki Suga, Kawasaki (JP); Michiko Takei, Kawasaki (JP); Akito Hara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/637,276

(22) Filed: Aug. 11, 2000

(30) Foreign Application Priority Data

Aug. 19, 1999 (JP) ............................................ 11-232546

(51) Int. Cl.[7] .......................... H01L 21/20; H01L 21/36
(52) U.S. Cl. .................. 438/488; 438/479; 438/482; 438/485; 438/486; 117/9; 117/37; 117/43; 117/54
(58) Field of Search ................. 117/9, 37, 43, 117/54; 216/55, 62; 438/311, 404, 488, 166, 479

(56) References Cited

U.S. PATENT DOCUMENTS

| | | | |
|---|---|---|---|
| 4,876,360 A | | 1/1990 | Guckel et al. |
| 4,897,360 A | | 1/1990 | Guckel et al. |
| 5,077,233 A | * | 12/1991 | Mukai .................. 438/412 |
| 5,264,072 A | * | 11/1993 | Mukai .................. 117/43 |
| 5,663,077 A | * | 9/1997 | Adachi et al. ............. 438/151 |
| 5,756,364 A | * | 5/1998 | Tanaka et al. ............. 438/30 |

FOREIGN PATENT DOCUMENTS

JP          10-092745          4/1998

* cited by examiner

*Primary Examiner*—Kamand Cuneo
*Assistant Examiner*—Asok Kumar Sarkar
(74) *Attorney, Agent, or Firm*—Greer, Burns & Crain, Ltd.

(57) ABSTRACT

A first layer made of polysilicon is formed on the surface of an underlying substrate. The surface of the first layer is exposed to an environment which etches silicon oxide. If the surface of the first layer is covered with a silicon oxide film, the silicon oxide film is removed. An energy is supplied to the first layer, the energy allowing silicon crystal to re-grow. Solid phase growth of silicon occurs in the first layer to planarize the surface thereof. A polysilicon film having small root mean square of roughness can be formed.

11 Claims, 8 Drawing Sheets

US 6,677,222 B1

METHOD OF MANUFACTURING SEMICONDUCTOR DEVICE WITH POLYSILICON FILM

This application is based on Japanese Patent Application HEI 11-232546, filed on Aug. 19, 1999, the entire contents of which are incorporated herein by reference.

BACKGROUND OF THE INVENTION

Field of the Invention

The present invention relates to a method of manufacturing a semiconductor device, particularly a semiconductor device with a polysilicon film.

A method of manufacturing a thin film transistor (TFT) using a polysilicon film will be described. An amorphous silicon film is formed on a glass substrate by chemical vapor deposition. An excimer laser beam is radiated to the amorphous silicon film to polycrystallize it. Polycrystallization by laser radiation can be performed at a temperature of a strain point or lower of a glass substrate and it provides the advantage that an expensive quartz substrate is not necessary.

A gate insulating film is formed to a thickness of 100 to 150 nm on the polycrystallized silicon film. On this gate insulating film, a metal film for a gate electrode is formed. By patterning the metal film and gate insulating film, the polysilicon film is exposed in the areas where source and drain regions are to be formed. Impurities are doped into the exposed polysilicon regions to form the source and drain regions.

Polycrystallization with an excimer laser beam forms protrusions along crystal grain boundaries of a polysilicon film. These protrusions are higher than that formed when an amorphous silicon film on a quartz substrate is polycrystallized by heating it in an electric furnace. Therefore, polycrystallization with an excimer laser forms relatively large protrusions on the surface of a polysilicon film.

It is difficult to form a thin gate insulating film on the polysilicon film if this film has large protrusions on the surface thereof. An electric field concentrates upon the tips of protrusions and dielectric breakdown is likely to occur. Protrusions on the surface of a polysilicon film hinder micro fine patterning.

SUMMARY OF THE INVENTION

It is an object of the present invention to provide a method of manufacturing a semiconductor device capable of forming a polysilicon film with a small roughness.

According to one aspect of the present invention, there is provided a method of manufacturing a semiconductor device comprising the steps of: forming a first layer on a surface of an underlying substrate, the first layer being made of polysilicon; exposing a surface of the first layer to an environment which etches silicon oxide, and if the surface of the first layer is covered with a silicon oxide film, removing the silicon oxide film; and supplying an energy to the first layer, the energy allowing silicon crystal to re-grow.

The root mean square (RMS) of roughness of the first layer can be made small by re-growing silicon crystals after the silicon oxide film is removed. By using this polysilicon film, a highly reliable and fine TFT can be manufactured.

DETAILED DESCRIPTION OF THE PREFERRED EMBODIMENTS

With reference to FIGS. 1A to 1D, a method of forming a polysilicon film according to a first embodiment of the invention will be described.

Figure 1A:
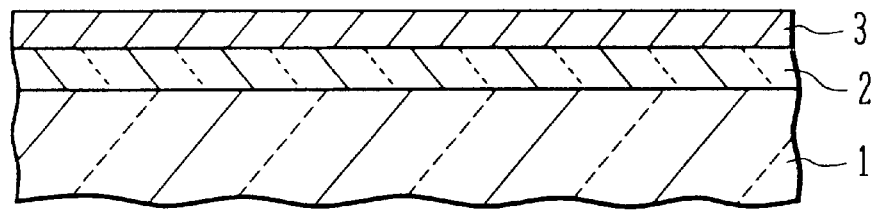
FIGS. 1A to 1D are cross sectional views of a substrate illustrating a method of forming a polysilicon film according to an embodiment of the invention.

As shown in FIG. 1A, on a surface of a glass substrate 1, a $SiO_2$ film 2 is formed to a thickness of 200 nm by chemical vapor deposition (CVD). A SiN film may be formed in place of the $SiO_2$ film 2. A two-layered film of SiN and $SiO_2$ may be formed. On the surface of the $SiO_2$ film 2, an amorphous silicon film 3 is formed to a thickness of 50 nm by plasma enhanced chemical vapor deposition (PE-CVD).

Figure 1B:
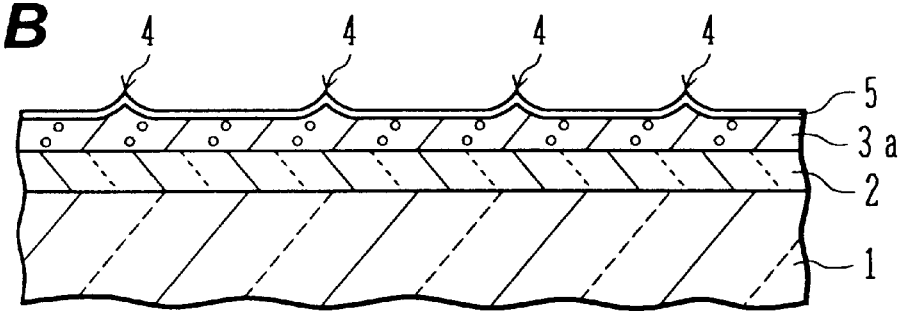

As shown in FIG. 1B, an XeCl excimer laser beam is radiated to the amorphous silicon film 3 in the atmospheric air to polycrystallize it and obtain a polysilicon film 3a. The cross sectional shape of the excimer laser beam is a stripe having a width of 1.2 mm, and the time duration (pulse width) of each shot is 40 ns. This striped radiation area is moved in a direction perpendicular to the longer axis of the stripe at each shot to scan the whole surface of the substrate. This radiation area is moved in such a manner that an overlap ratio (a ratio of an overlapped area between a radiation area at one shot and a radiation area at the next shot to a whole radiation area at one shot) is about 92 to 99%. The energy density of the excimer laser is, for example, 300 to 500 $mJ/cm^2$.

After the laser radiation, the surface of the polysilicon film 3a has protrusions 4 formed along the crystal grain boundaries. A root mean square (RMS) of roughness measured with an atomic force microscope (AFM) was about 14 nm. Some protrusions observed had a height in excess of the thickness of 50 nm of the amorphous silicon film 3.

Since the heat treatment is performed in an oxygen containing atmosphere, the surface of the polysilicon film 3a is oxidized and a silicon oxide film 5 is formed thereon.

Figure 1C:
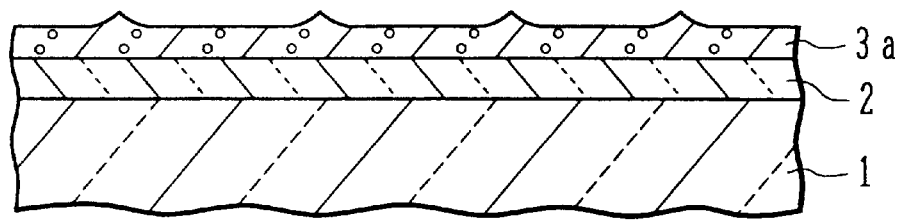

As shown in FIG. 1C, the silicon oxide film 5 is removed by using etchant of a hydrofluoric acid group. The surface of the polysilicon film 3a is therefore exposed. The root mean square of roughness of the polysilicon film 3a after the silicon oxide film 5 was removed was about 12 nm. The silicon oxide film may be removed through dry etching using fluorine containing gas.

The process realizing the state shown in FIG. 1D will be described. After the silicon oxide film 5 is removed, the substrate is quickly placed in a vacuum chamber which is evacuated to a pressure of $1 \times 10^{-7}$ Torr. A heat treatment is performed for 2 hours at a temperature of 550° C. A root mean square of roughness of the polysilicon film 3a after the heat treatment was about 6 nm.

As described above, the root mean square of roughness of the polysilicon film 3a can be made small by performing the planarizing heat treatment after the silicon oxide film 5 is removed. The effect of the planarizing heat treatment was small when this treatment was performed without removing the silicon oxide film 5 in the process of FIG. 1C. The reason for this may be ascribed to that motion of silicon atoms during the heat treatment is hard to occur if the surface of the polysilicon film is covered with the silicon oxide film. In this embodiment, although the substrate is quickly placed in the vacuum chamber after the silicon oxide film 5 is removed, it is preferable to perform the planarizing heat treatment without exposing the substrate in the atmospheric air.

In this embodiment, the planarizing heat treatment was performed under the conditions of a pressure of $1 \times 10^{-7}$ Torr and a temperature of 550° C. Planarization hardly progressed at the pressure of $1 \times 10^{-5}$ Torr and a temperature of 550° C. Planarization similar to the first embodiment was possible at a pressure of $1 \times 10^{-5}$ Torr and a temperature raised to 580° C.

Figure 1D:
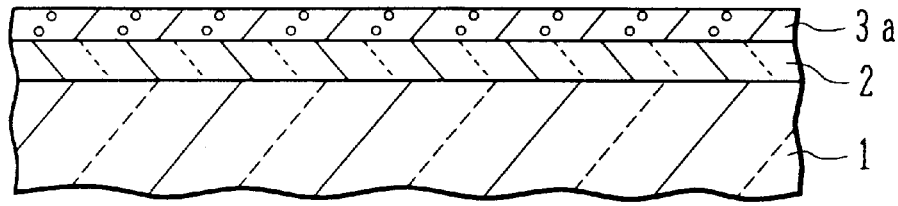

In the first embodiment, the planarizing heat treatment described with FIG. 1D was performed in the vacuum chamber. Instead of the heat treatment in the vacuum chamber, a lamp heating method was applied which showed a reduction in the root mean square of roughness although the reduction amount was small.

Next, a method of forming a polysilicon film according to a second embodiment will be described. As described in the first embodiment, the root mean square of roughness of the polysilicon film 3a shown in FIG. 1B immediately after polycrystallization is about 14 nm, and that of the polysilicon film 3a shown in FIG. 1B after removal of the silicon oxide film 5 is about 12 nm. The root mean square of roughness becomes slightly smaller merely by removing the silicon oxide film 5. The reason for this may be ascribed to that the region near to the tip of each protrusion is easy to be oxidized and the silicon oxide film in this region is thicker than the other region. The second embodiment positively utilizes this phenomenon.

In the first embodiment, after the silicon oxide film 5 shown in FIG. 1B is formed, the oxide film 5 is removed at the process shown in FIG. 1C. In the second embodiment, after polycrystallization illustrated in FIG. 1B, the surface of the polysilicon film 3a is oxidized intentionally. This oxidization is performed, for example, by exposing the surface of the polysilicon film 3a to oxygen plasma. It is considered that the region near the tip of each protrusion 4 shown in FIG. 1B is oxidized with a priority over the other region.

After the oxygen plasma process, the silicon oxide film is removed through dry etching using $CHF_3$. Similar to removal of the silicon oxide film of the first embodiment, the silicon oxide film may be removed through wet etching using hydrofluoric acid containing etchant. Thereafter, a planarizing heat treatment is performed similarly to the process shown in FIG. 1D of the first embodiment.

A root mean square of roughness of the polysilicon film formed by the second embodiment method was about 5 nm. This value is slightly smaller than that of the first embodiment.

In forming a TFT by using a polysilicon film, for example, the polysilicon film is patterned in a stripe shape having a width of several $\mu$m. After a silicon film (root mean square roughness of 12 nm) polycrystallized by excimer laser radiation was patterned in a stripe shape having a width of 3 $\mu$m, the edge of the silicon pattern was irregular and rough. This roughness may hinder fine patterning of TFT. The surface roughness of a silicon film influences the etching characteristic, and etching residue is likely to be formed. After the polysilicon film formed by the second embodiment method was patterned in a stripe shape having a width of 3 $\mu$m, the edge of the silicon pattern was smooth. It is therefore possible to make TFT finer.

In the first embodiment, as described in the process shown in FIG. 1B, the amorphous silicon film is polycrystallized by excimer laser radiation. A root mean square of roughness of a silicon film polycrystallized by a heat treatment in a vacuum chamber instead of using laser radiation, is smaller than that of a silicon film polycrystallized by laser radiation. A root mean square of roughness of a silicon film polycrystallized by a heat treatment in a vacuum chamber was about 4 nm. Also in this case, it has been found that the root mean square of roughness can be made small by removing the silicon oxide film at the process of the first embodiment shown in FIG. 1C and performing a planarizing heat treatment at the process shown in FIG. 1D.

For example, an amorphous silicon film was formed on a quartz substrate, and the silicon film polycrystallized and planarized by a heat treatment at a high temperature of about 600° C. had a root mean square of roughness of about 3.8 nm. An Ni containing amorphous silicon film was formed on a glass substrate, and the silicon film polycrystallized and planarized by a heat treatment at a low temperature of about 550° C. had a root mean square of roughness of about 3.5 nm.

Next, with reference to FIGS. 1A to 1D and FIG. 2, a method of forming a polysilicon film according to a third embodiment will be described. In the first embodiment, the silicon film is polycrystallized by laser radiation in the atmospheric air as described at the process shown in FIG. 1B, and then the substrate is heated in the vacuum chamber to planarize the surface of the polysilicon film as described at the process shown in FIG. 1D. In the third embodiment, not only the polycrystallizing process but also the planarizing process are executed by laser radiation. Namely, laser radiation (first laser radiation) is performed for polycrystallizing amorphous silicon, and then laser radiation (second laser radiation) is performed for planarizing the polysilicon film.

The method of forming a polysilicon film according to the third embodiment uses the same processes up to the removal process of the silicon oxide film 5 of the first embodiment illustrated in FIG. 1C. In the third embodiment, an excimer laser beam is radiated to the polysilicon film 3a shown in FIG. 1C to planarize the surface thereof. This second laser radiation was performed under the conditions of a pressure of $1 \times 10^{-1}$ Pa and an overlap ratio of 95%. It is preferable to perform the second laser radiation without exposing the substrate to atmospheric air after the silicon oxide film 5 shown in FIG. 1B is removed.

Figure 2:
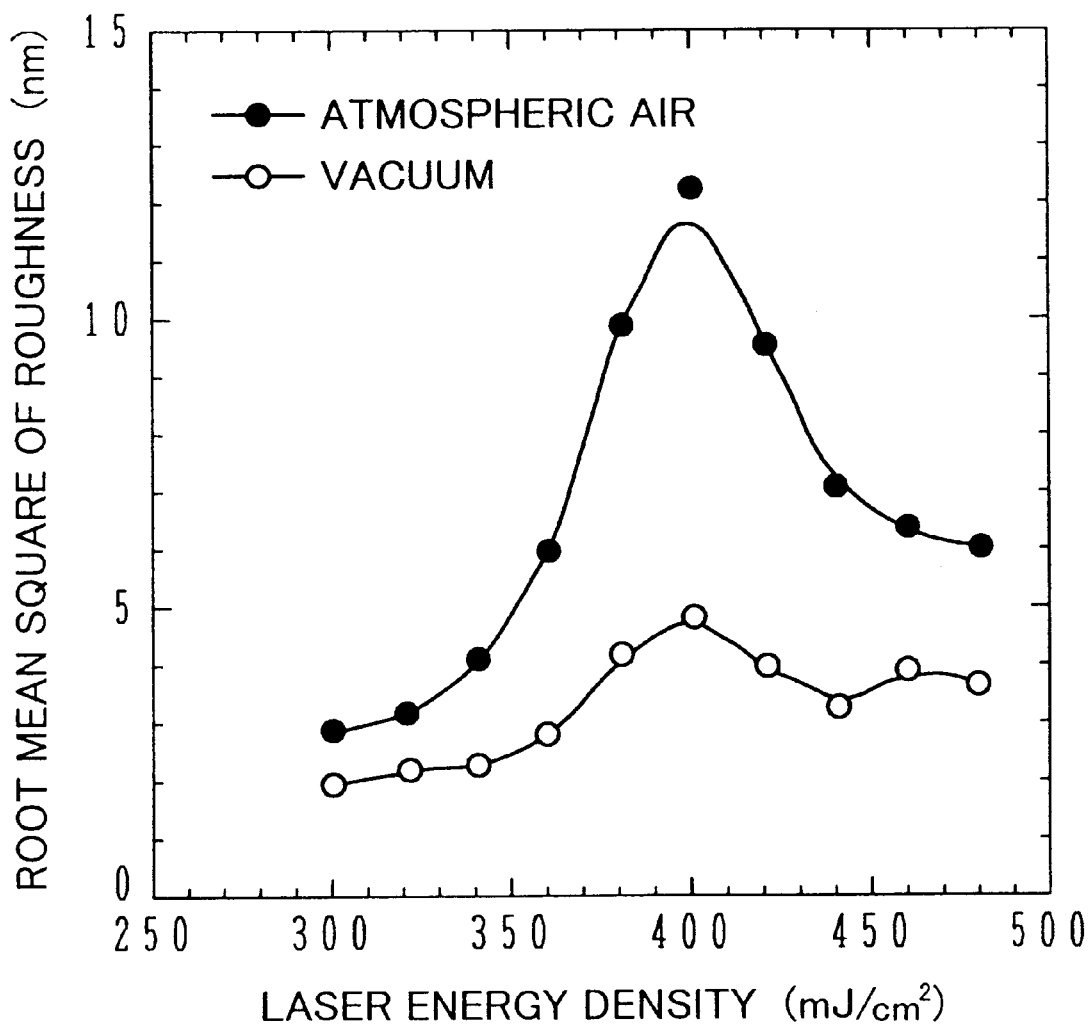
FIG. 2 is a graph showing root mean squares of roughness of polysilicon films polycrystallized by laser radiation, as a function of a laser energy density.

With reference to FIG. 2, the conditions of the first laser radiation will be described. The abscissa of FIG. 2 represents a laser energy density of the first laser radiation in the unit of $mJ/cm^2$ and the ordinate represents a root mean square of roughness in the unit of nm.

Black circles shown in FIG. 2 indicate root mean squares of roughness of polysilicon films polycrystallized by radiation of XeCl excimer laser beams under the conditions of a pulse width of 40 ns, a stripe radiation region width of 1.2 mm and an overlap ratio of 96%. White circles shown in FIG. 2 indicate root mean squares of roughness of polysilicon films polycrystallized by laser radiation in vacuum at a pressure of $1\times10^{-3}$ Pa.

If laser radiation is performed in the atmospheric air, the root mean square of roughness becomes maximum at an energy density of 400 mJ/cm$^2$ and takes as high a value as about 12 nm. If laser radiation is performed in a vacuum atmosphere, the root mean square of roughness is 5 nm or smaller. An average diameter of crystal grains of a silicon film subjected to laser radiation in the atmospheric air was about 0.5 μm, and that of a silicon film subjected to laser radiation in the vacuum atmosphere was about 0.25 μm or smaller, both observed with a scanning type electron microscope. Protrusions on the surface of the silicon film subjected to laser radiation in the atmospheric air were formed along the crystal grain boundaries.

If the first laser radiation is performed in a vacuum atmosphere, although a polysilicon film having a small root mean square of roughness can be obtained, the average diameter of crystal grains is small. By using a silicon film having a small average diameter of crystal grains, a TFT having proper characteristics is difficult to form.

Figure 3:
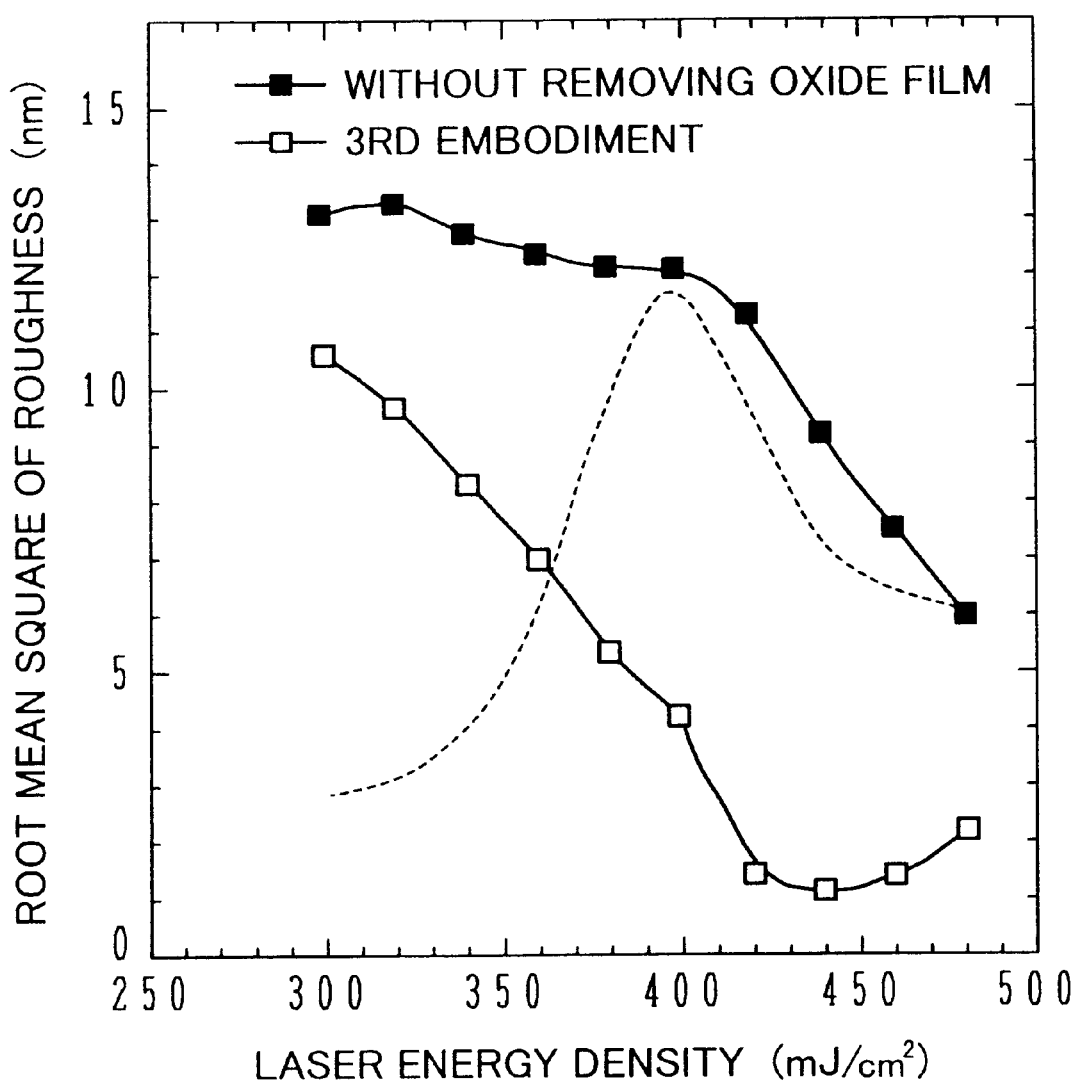
FIG. 3 is a graph showing root mean squares of roughness of polysilicon films formed by a third embodiment method and as comparison examples, as a function of a laser energy density at the second laser radiation.

FIG. 3 is a graph showing root mean squares of roughness of polysilicon films formed by the third embodiment method and as comparison examples. The abscissa of FIG. 3 represents a laser energy density in the unit of mJ/cm$^2$ and the ordinate represents a root mean square of roughness in the unit of nm. White squares shown in FIG. 3 indicate root mean squares of polysilicon films formed by the third embodiment method. Black squares indicate root mean squares of polysilicon films formed by performing the second laser radiation without removing the silicon oxide film 5 shown in FIG. 1B. The laser energy density at the abscissa corresponds to the laser energy density at the second laser radiation. The energy density at the first laser radiation is 400 mJ/cm$^2$.

A broken line shown in FIG. 3 indicates the root mean squares of roughness indicated by the black circles shown in FIG. 2. The abscissa for this broken line corresponds to the energy density at the first laser radiation.

The second laser radiation was performed without removing the silicon oxide film, and the root mean square of roughness hardly reduced in a laser energy density range not higher than 400 mJ/cm$^2$, as indicated by the black squares. In a laser energy density range not lower than 400 mJ/cm$^2$, although the root mean square of roughness was reduced, the root mean square of roughness of the polysilicon film was equal to that of a polysilicon film which was formed by performing only the laser radiation for polycrystallization at the energy density of not lower than 400 mJ/cm$^2$.

In the third embodiment, as indicated by the white squares, the root mean square of roughness was reduced by the second laser radiation. When the energy density at the second laser radiation is set to 400 to 480 mJ/cm$^2$, the root mean square of roughness is 4 nm or smaller. This is nearly equal to the root mean square of a silicon film polycrystallized through solid phase growth in a vacuum chamber.

Polysilicon films formed by the third embodiment method were analyzed with a scanning type electron microscope. The crystal grain diameter of the polysilicon film formed by the third embodiment method was nearly equal to or slightly larger than the average diameter of crystal grains after the first laser radiation. Protrusions formed along the crystal grain boundaries almost disappeared.

The first laser radiation is performed preferably at the energy density providing a large root mean square of roughness. A polysilicon film having a large diameter of crystal grains can therefore be formed. For example, the first laser radiation is performed preferably at the energy density providing a root mean square of roughness of 5 nm or higher. The second laser radiation is performed preferably at an energy density higher than that of the first laser radiation. The effects of lowering the root mean square of roughness of a polysilicon film can be enhanced. If the energy density of the second laser radiation is set too high, micro-crystallization of the silicon film progresses. It is therefore preferable to set the root energy density to a threshold value at which micro-crystallization occurs or smaller. The substrate may be heated at the second laser radiation. By heating the substrate, the quality of crystal can be improved.

In the third embodiment, although the overlap ratio at the second laser radiation is set to 95%, a different overlap ratio may be set. According to the experiments made by the present inventors, it has been found that the planarizing effects are less at an overlap ratio not higher than 90%. It is therefore preferable to set the overlap ratio at the second laser radiation to 90% or higher. If the overlap ratio cannot be set to 90% or higher due to restrictions of a manufacture system, for example, two shots of laser radiation are performed for the same radiation area which is moved at an overlap ratio of 80%. In this case, a substantial overlap ratio of 90% can be expected.

In the third embodiment, although the atmospheric pressure at the second laser radiation is set to $1\times10^{-1}$ Pa, a different pressure may be set.

Figure 4:
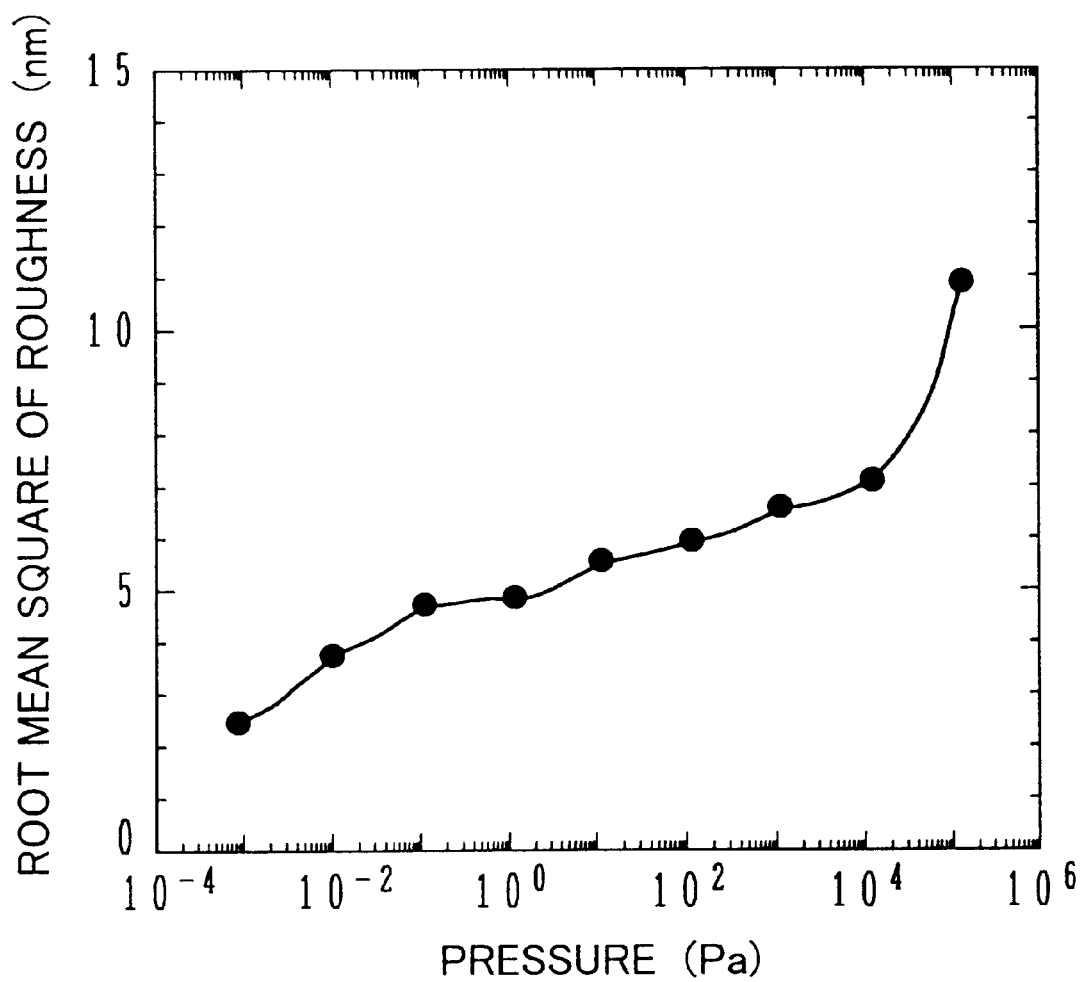
FIG. 4 is a graph showing root mean squares of roughness of polysilicon films formed by the third embodiment method, as a function of an atmospheric pressure at the second laser radiation.

FIG. 4 is a graph showing root mean squares of polysilicon films as a function of an atmospheric pressure at the second laser radiation. The abscissa of FIG. 4 represents a pressure in the unit of Pa, and the ordinate represents a root mean square of roughness in the unit of nm. As the pressure is lowered from the atmospheric air pressure to $1\times10^4$ Pa, the root mean square of roughness lowers abruptly. In a pressure range from $1\times10^4$ Pa to $1\times10^{-1}$ Pa, as the pressure lowers, the root mean square of roughness lowers gently. In a pressure range of $1\times10^{-1}$ Pa or lower, the tendency of lowering the root mean square of roughness becomes stronger.

It can be understood from FIG. 4 that it is preferable to set the pressure at the second laser radiation to $1\times10^4$ Pa or lower, or more preferable to set it to $1\times10^{-1}$ Pa.

The second laser radiation may be performed in an inert gas atmosphere, e.g., in a nitrogen gas atmosphere. In this case, it is preferable that before nitrogen gas is introduced into a vacuum chamber accommodating a substrate, the vacuum chamber is evacuated to $1\times10^4$ Pa or lower, or more preferably to $1\times10^{-1}$ Pa.

It can be understood that the surface of a polysilicon film can be planarized by setting the pressure at the second laser radiation lower than that at the first laser radiation. For example, if the pressure at the first laser radiation is set to $1\times10^2$ Pa, the pressure at the second laser radiation is set to $1\times10^{-3}$ Pa. This is because as the pressure lowers, the oxygen partial pressure lowers.

Namely, the total pressure at the laser radiation is not important, but the oxygen partial pressure in the atmosphere at the laser radiation or the oxygen amount supplied to a unit area of a silicon film surface, is important. In other words, the oxygen partial pressure at the second laser radiation or the oxygen amount supplied to a unit area of a silicon film surface, is set smaller than that at the first laser radiation so that the surface of the silicon film can be planarized.

Consider now the case wherein after the first laser radiation is performed in an atmosphere at a pressure of $1 \times 10^{-2}$ Pa, the vacuum chamber is evacuated to $1 \times 10^{-3}$ Pa and nitrogen is introduced to set a pressure to $1 \times 10^5$ Pa. In this case, the pressure in the atmosphere at the second laser radiation becomes higher than that at the first laser radiation. However, in terms of the oxygen partial pressure, it is lower at the first laser radiation than at the second laser radiation. It is therefore possible to planarize the surface of a silicon film.

Consider next the case wherein a silicon oxide film is already formed on the surface of a silicon film at the first laser radiation. The pressure at the first laser radiation is $1 \times 10^{-3}$ Pa and the pressure at the second laser radiation is $1 \times 10^{-1}$ Pa. The oxygen partial pressure is higher at the second laser radiation than at the first laser radiation. However, since the silicon oxide film is already formed on the surface of the silicon film at the first laser radiation, the oxygen amount supplied to the unit area of the silicon film surface is smaller at the second laser radiation than at the first laser radiation. Therefore, the silicon film surface can be planarized.

The second laser radiation was performed in the atmospheric air after the silicon oxide film was removed. In this case, the planarizing effects were not exhibited. it can therefore be understood that the second laser radiation is preferably executed in a non-oxidizing atmosphere.

Next, a method of forming a polysilicon film according to a fourth embodiment will be described. In the third embodiment, the first laser radiation is performed in the atmospheric air to form a polysilicon film having a large average diameter of crystal grains. The reason why the average diameter of crystal grains is larger than that of a polysilicon film formed by the first laser radiation in vacuum may be ascribed either to coverage of the surface of the silicon film with the oxide film or to the influence of oxygen contained in the atmospheric air.

In the case of the first laser radiation in the atmospheric air, the state of the silicon oxide film on the surface of the silicon film changes with an atmosphere during the laser radiation, e.g., humidity or temperature, and the state of the formed polysilicon film, e.g., an average crystal grain diameter, may be changed. The fourth embodiment provides a method of forming a polysilicon film not susceptible to the influence of an atmosphere during the first laser radiation.

The fourth embodiment will be described with reference to FIGS. 1A to 1D and by comparing it with the first embodiment method of forming a polysilicon film. After the amorphous silicon film 3 shown in FIG. 1A is formed, the surface silicon oxide film is removed. After the silicon oxide film is removed, a silicon oxide film is formed to a predetermined thickness on the surface of the amorphous silicon film 3. The silicon oxide film may be formed by heat treatment in an oxidizing atmosphere, radiation of ultraviolet rays, exposure to oxygen plasma, deposition by chemical vapor deposition or sputtering, or other methods.

After the silicon oxide film is formed on the surface of the amorphous silicon film, the first laser radiation is performed to polycrystallize the amorphous silicon film. This first laser radiation is performed in vacuum or in inert gas. The polysilicon film 3a shown in FIG. 1B is therefore formed. The following processes are similar to those of the third embodiment.

Figure 5:
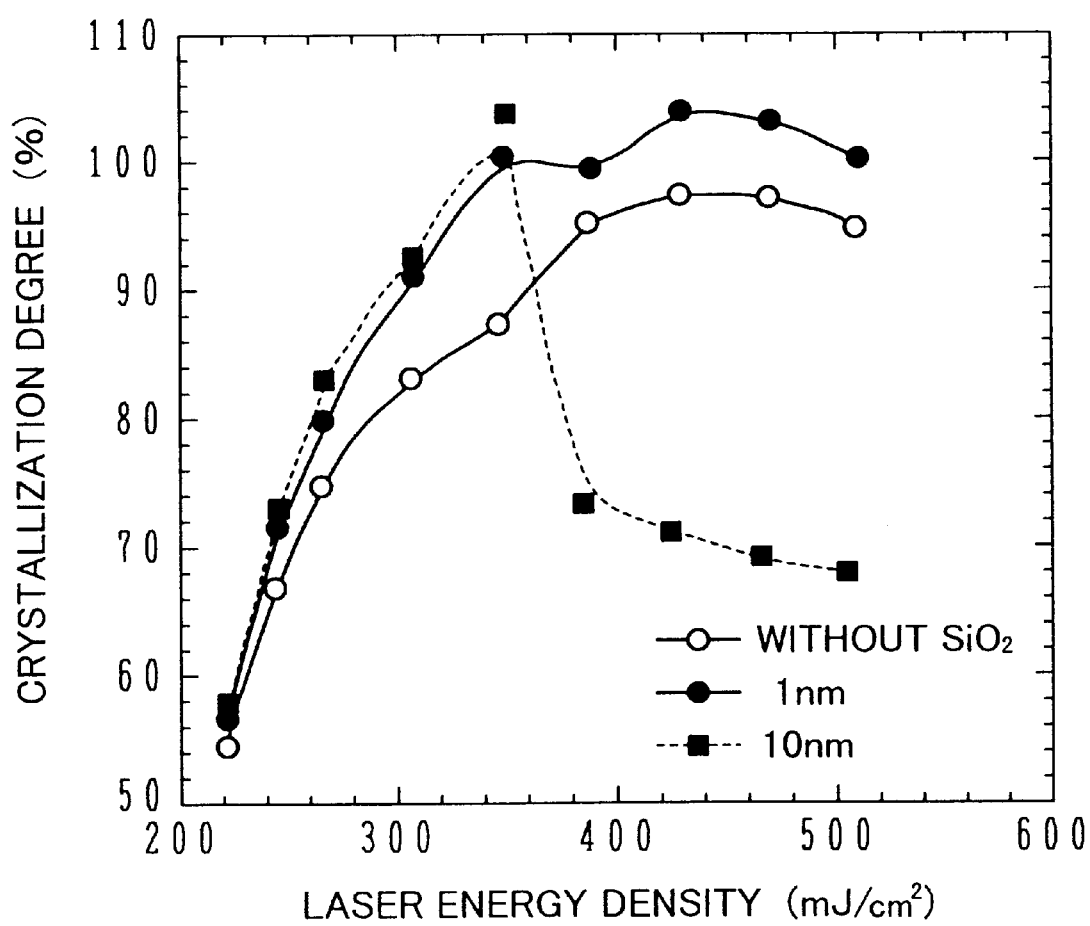
FIG. 5 is a graph showing crystallization degrees of polysilicon films formed by changing the thickness of a silicon oxide film on an amorphous silicon film formed by a fourth embodiment, as a function of a laser energy density at the first laser radiation.

FIG. 5 is a graph showing a crystallization degree as a function of the energy density of the first laser radiation, with the thicknesses of silicon oxide films formed on the surfaces of amorphous silicon film 3 being set different. The abscissa represents an energy density in the unit of $mJ/cm^2$ and the ordinate represents a crystallization degree in the unit of %. The crystallization was evaluated from a peak height of reflection light at a wavelength of 280 nm when ultraviolet rays are radiated to the silicon film. A peak height obtained from a single crystal wafer was used as a crystallization degree of 100%. White circles in FIG. 5 indicate the peak heights when a silicon oxide film is not used, and black circles and squares indicate the peak heights of silicon oxide films having thicknesses of 1 nm and 10 nm, respectively.

With the silicon oxide film having the thickness of 10 nm, as the laser energy density exceeds 340 $mJ/cm^2$, the crystallization degree lowers abruptly. It is therefore preferable to set the thickness of the silicon oxide film to be formed on the surface of the amorphous silicon film, to 10 nm or thinner.

In the fourth embodiment, the surface of the amorphous silicon is covered with the silicon oxide film before the first laser radiation. Therefore, the quality of the polysilicon film is not susceptible to the influence of an atmosphere during the first laser radiation.

In the fourth embodiment, the silicon oxide film is formed before the first laser radiation. Instead of forming the silicon oxide film before the first laser radiation, the atmosphere during the first laser radiation may be controlled. Also in this case, a stabilized quality of the polysilicon film can be expected. For example, after the silicon oxide film formed on the surface of the amorphous silicon film is removed, the substrate may be placed in a vacuum chamber to radiate a laser beam while the flow rate of oxygen gas is controlled. Oxygen gas and inert gas may be flowed by controlling the flow ratio therebetween.

By performing the first laser radiation while the substrate is heated in inert gas, it was possible to form a polysilicon film having a crystal grain diameter similar to the fourth embodiment. The reason for this may be ascribed either to that water contents and oxygen absorbed to the wall of a vacuum chamber heated by heating the substrate are discharged to the inside of the vacuum chamber, or to that the crystal grain diameter becomes large by heating the substrate.

In the first to fourth embodiments, the energy density of the first laser radiation is set to 400 $mJ/cm^2$. The first laser radiation may be performed at a different energy density so long as the crystallization degree can be made large. For example, a preferable range of the energy density of the first laser radiation is not lower than 360 $mJ/cm^2$. If the energy density is set too high, micro-crystallization occurs although the crystallization degree becomes high. Micro-crystallization leaves damages in the silicon film. It is therefore preferable to set the energy density to a threshold value or lower at which micro- crystallization does not occurs. According to the experiments made by the present inventors, micro-crystallization occurred at the energy density of 450 $mJ/cm^2$ or higher. A preferable energy density changes with a pulse width and beam profile of a laser beam used, heating or not heating the substrate, or the like.

In the third embodiment, the overlap ratio during the first laser radiation is set to 95%. If the number of radiations of a laser beam to the same area on a silicon film surface exceeds 100, roughness of the film surface becomes large and damages in the film become large. It is therefore preferable to set the overlap ratio during the first laser radiation to 99% or lower. Even if the overlap ratio during the second laser radiation was set to 99% or larger, silicon films were not damaged.

Next, a method of manufacturing a TFT by using a polysilicon film formed by any one of the first to fourth embodiment methods will be described.

Figure 6A:
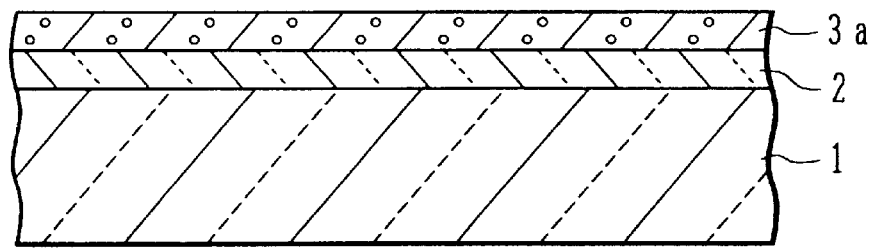
FIGS. 6A to 6D are cross sectional views of a substrate illustrating a method of manufacturing a TFT by using polysilicon films formed by any one of the first to fourth embodiment methods.

As shown in FIG. 6A, the surface of a glass substrate 1 is formed with an $SiO_2$ film 2 having a thickness of 200 nm and a polysilicon film 3a having a thickness of 50 nm. Manufacture processes up to this state are similar to the processes illustrated in FIGS. 1A to 1D. The polysilicon film 3a is formed by any one of the first to fourth embodiment methods.

Figure 6B:
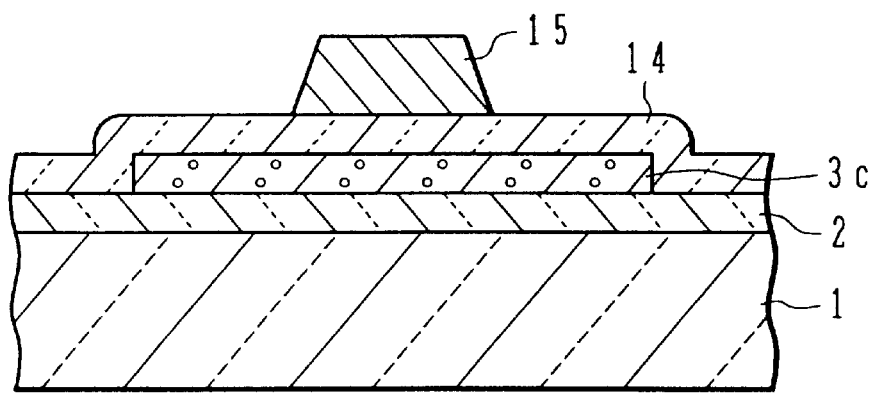

As shown in FIG. 6B, the silicon film 3a is patterned to leave an active region 3c of a silicon thin film. A number of active regions 3c are dispersedly distributed on the surface of the glass substrate 1. Etching the polysilicon film is performed by reactive ion etching (RIE) using mixture gas of $CF_4$ and $O_2$. A gate insulating film 14 of $SiO_2$ is formed to a thickness of 120 nm on the $SiO_2$ film, covering the active region 3c. Plasma enhanced chemical vapor deposition (PE-CVD) using $SiH_4$ and $N_2O$ is utilized for forming the gate insulating film 14.

A gate electrode 15 made of AlSi alloy and having a thickness of 300 nm is formed on the surface of the gate insulating film 14 in a partial area above the active region 3c. The Si concentration of the gate electrode 15 is 0.2 wt. %. Sputtering is performed for deposition of the AlSi alloy film, and phosphoric acid containing etchant is utilized for etching the AlSi alloy film.

Figure 6C:
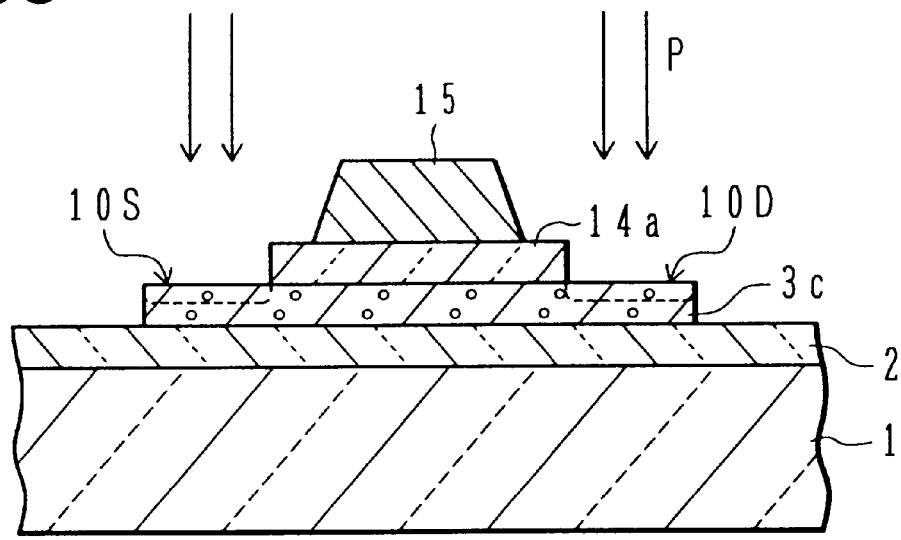

As shown in FIG. 6C, the gate insulating film 14 is patterned to leave a gate insulating film 14a. For etching the gate insulating film 14, RIE using mixture gas of $CHF_3$ and $O_2$ is performed. The gate insulating film 14a extends outward by about 1 nm on both sides of the gate electrode 15. The active region 3c extends outward on both sides of the gate insulating film 14a.

In the description with FIG. 6C, although position alignment between the gate electrode 15 and gate insulating film 14a is established by ordinary photolithography, the gate electrode 15 and gate insulating film 14a may be aligned in position in a self-alignment manner. For example, the extended regions of the gate insulating film 14a may be formed in a self-alignment manner by utilizing anodic oxidation of an Al gate electrode as disclosed in the publication of Japanese Patent Application HEI 8-332602.

Phosphorous ions are implanted into the extended regions of the active region 3c on both sides of the gate insulating film 14a. This ion doping is performed under the condition that phosphorous ions are not doped into the region covered with the gate insulating film 14a.

Figure 6D:
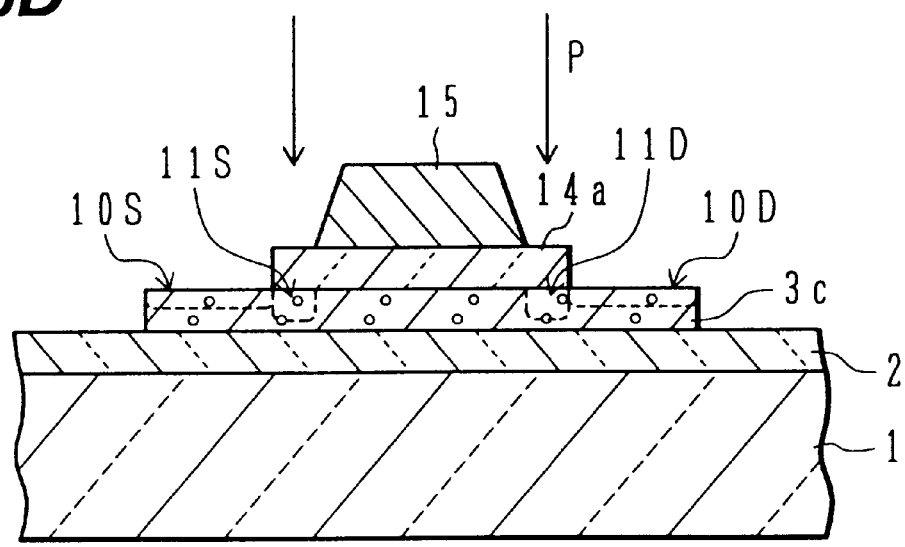

As shown in FIG. 6D, phosphorous ions are implanted again. This ion doping is performed under the condition that phosphorous ions creep under the extended regions of the gate insulating film 14a on both sides of the gate electrode 15. Next, implanted phosphorous ions are activated by excimer laser annealing. A low concentration source region 11S and a low concentration drain region 11D are therefore formed under the extended regions of the gate insulating film 14a on both sides of the gate electrode 15. In the regions outside of the extended regions, a high concentration source region 10S and a high concentration drain region 10D are also formed.

Figure 7:
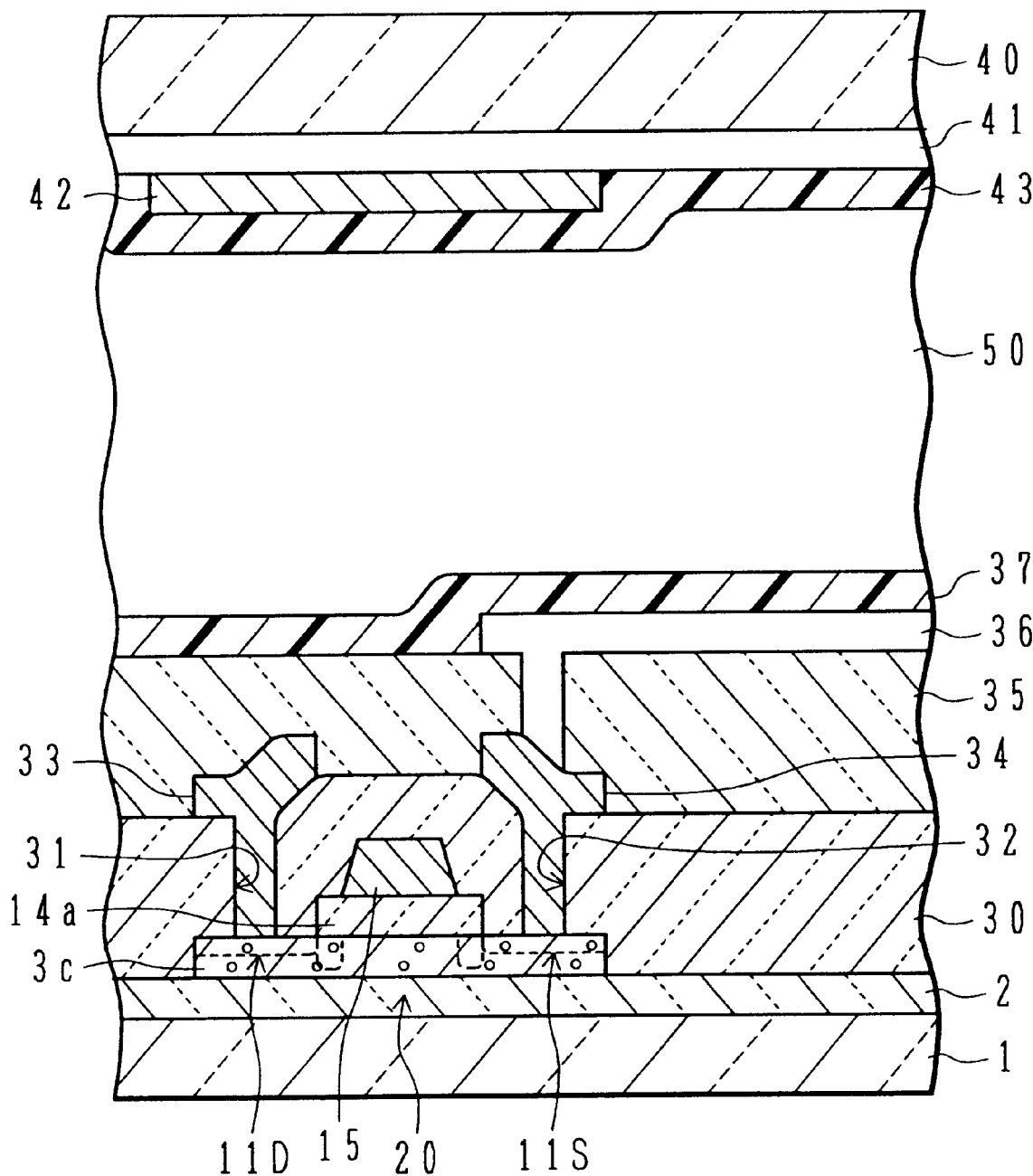
FIG. 7 is a cross sectional view of a liquid crystal display using TFTs formed by polysilicon films by any one of the first to fourth embodiment methods.

FIG. 7 is a cross sectional view of an active matrix type liquid crystal display using TFTs. A $SiO_2$ film 2 is formed on a glass substrate 1, and a TFT 20 is formed on the surface of the $SiO_2$ film 2.

A $SiO_2$ film 30 having a thickness of 400 nm is formed on the $SiO_2$ film 2, covering TFT 20. For example, the $SiO_2$ film 30 is formed by PE-CVD. The $SiO_2$ film 30 is formed with contact holes 31 and 32 at positions corresponding to high concentration drain and source regions 10D and 10S. For example, the contact holes 31 and 32 are formed by RIE using mixture gas of $CHF_3$ and $O_2$.

A drain bus line 33 is formed on the surface of the $SiO_2$ film 30. The drain bus line 33 is connected via the contact hole 31 to the high concentration drain region 10D. The drain bus line 33 has a two-layered structure of a Ti film of 50 nm in thickness and an AlSi alloy film of 200 nm in thickness.

An interconnect electrode 34 is formed on the surface of the $SiO_2$ film 30 at the position corresponding to the contact hole 32. The interconnect electrode 34 is connected to the high concentration source region 10S.

A SiN film 35 is formed on the $SiO_2$ film 30, covering the drain bus line 33 and interconnect electrode 34. On the surface of the SiN film 35, a pixel electrode 36 made of indium tin oxide (ITO) is formed. The pixel electrode 36 is connected to the interconnect electrode 34 via a contact hole formed through the SiN film 35. An orientation film 37 is formed on the SiN film 35, covering the pixel electrode 36.

An opposing substrate 40 is disposed facing the glass substrate 1. A common electrode 41 of ITO is formed on an opposing surface of the opposing substrate 40. A light shielding film 42 is formed on the surface of the common electrode 41 in a predetermined area to be light shielded. An orientation film 43 is formed on the surface of the common electrode 41, covering the light shielding film 42. Liquid crystal material 50 is filled in between the two orientation films 37 and 43.

The active region 3c of TFT 20 is made of a polysilicon film formed by any one of the first to fourth embodiments so that the root mean square of roughness of the polysilicon film is small. It is therefore possible to miniaturize TFT 20 and prevent dielectric breakdown of the gate insulating film to be caused by electric field concentration.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device comprising the steps of:
   forming a first layer on a surface of an underlying substrate, the first layer being made of polysilicon;
   exposing a whole surface of the first layer to an environment which etches silicon oxide; and
   supplying an energy to the first layer, the energy allowing silicon crystal to re-grow.

2. A method according to claim 1, wherein said step of forming the first layer comprises the steps of:
   forming a second layer on the surface of the underlying substrate, the second layer being made of amorphous silicon or polysilicon; and
   radiating a first laser beam to the second layer to change the second layer to the first layer made of polysilicon.

3. A method of manufacturing a semiconductor device comprising the steps of:
   forming a first layer on a surface of an underlying substrate, the first layer being made of polysilicon;
   exposing a surface of the first layer to an environment which etches silicon oxide; and supplying an energy to the first layer, the energy allowing silicon crystal to re-grow;

wherein said step of forming the first layer comprises the steps of:

forming a second layer on the surface of the underlying substrate, the second layer being made of amorphous silicon or polysilicon; and radiating a first laser beam to the second layer to change the second layer to the first layer made of polysilicon;

wherein said step of radiating the first laser beam is executed in an oxidizing atmosphere.

4. A method of manufacturing a semiconductor device comprising the steps of:

forming a first layer on a surface of an underlying substrate, the first layer being made of polysilicon;

exposing a surface of the first layer to an environment which etches silicon oxide; and supplying an energy to the first layer, the energy allowing silicon crystal to re-grow;

wherein said step of forming the first layer comprises the steps of:

forming a second layer on the surface of the underlying substrate, the second layer being made of amorphous silicon or polysilicon; and radiating a first laser beam to the second layer to change the second layer to the first layer made of polysilicon; and further comprising a step of covering a surface of the second layer with a silicon oxide film, after the second layer is formed and before the first laser beam is radiated.

5. A method according to claim 1, further comprising a step of oxidizing the surface of the first layer, after the first layer is formed and before the surface of the first layer is exposed to the environment which etches silicon oxide.

6. A method according to claim 1, wherein in said step of supplying an energy to the first layer, the energy allowing silicon crystal to re-grow, an energy is supplied to the first layer in vacuum or in inert gas.

7. A method of manufacturing a semiconductor device comprising the steps of:

forming a first layer on a surface of an underlying substrate, the first layer being made of polysilicon;

exposing a surface of the first layer to an environment which etches silicon oxide; and supplying an energy to the first layer, the energy allowing silicon crystal to re-grow;

wherein said step of forming the first layer comprises the steps of:

forming a second layer on the surface of the underlying substrate, the second layer being made of amorphous silicon or polysilicon; and, radiating a first laser beam to the second layer to change the second layer to the first layer made of polysilicon;

wherein said step of supplying an energy to the first layer, the energy allowing silicon crystal to re-grow, includes a process of radiating a second laser beam to the first layer under a condition that an oxygen amount supplied to a unit area of the surface of the first layer during radiation of the second laser beam is smaller than an oxygen amount supplied to a unit area of the surface of the second layer during radiation of the first laser beam.

8. A method according to claim 7, wherein an energy density on the surface of the first layer while the second laser beam is applied is in a range from 400 mJ/cm$^2$ to 480 mJ/cm$^2$.

9. A method according to claim 7, wherein an energy density on the surface of the first layer while the second laser beam is applied is equal to or smaller than an energy density at which micro-crystallization occurs.

10. A method according to claim 7, wherein an energy density on the surface of the first layer while the second laser beam is applied is larger than an energy density on the surface of the second layer while the first laser beam is applied.

11. A method according to claim 1, further comprising a step of patterning the first layer to leave a plurality of island regions dispersedly distributed, after the energy for re-growing silicon crystals is given to the first layer.

* * * * *